(12) United States Patent
Feltner

(10) Patent No.: US 6,856,862 B1
(45) Date of Patent: Feb. 15, 2005

(54) LIGHT CURTAIN SAFETY SYSTEM FOR SEMICONDUCTOR DEVICE HANDLER

(75) Inventor: Thomas A. Feltner, Tracy, CA (US)

(73) Assignee: Xilinx, Inc., San Jose, CA (US)

( * ) Notice: Subject to any disclaimer, the term of this patent is extended or adjusted under 35 U.S.C. 154(b) by 149 days.

(21) Appl. No.: 10/391,821

(22) Filed: Mar. 18, 2003

(51) Int. Cl.[7] .............................................. G05B 19/00
(52) U.S. Cl. ............................. 700/245; 700/1; 700/56; 700/255; 250/221; 250/559.4
(58) Field of Search ................................ 700/245, 255, 700/1, 56; 250/221, 559.4; 414/700, 728; 703/24, 26; 175/52, 85; 340/556; 399/107

(56) References Cited

U.S. PATENT DOCUMENTS 5,015,840 A * 5/1991 Blau .......................... 250/221
5,280,622 A * 1/1994 Tino ........................... 700/255

* cited by examiner

Primary Examiner—Thomas G. Black
Assistant Examiner—McDieunel Marc
(74) Attorney, Agent, or Firm—Patrick T. Bever; Edel M. Young; Justin Liu

(57) ABSTRACT

A light curtain safety system for a semiconductor device handler that includes a programmable control unit and a robot mechanism that is selectively operated in response to signals generated by the control unit. The light curtain safety system includes an apparatus for generating a light curtain such that accessing the robot mechanism requires breaking the light curtain. The light curtain safety system detects an operating state of the semiconductor device handler using signals generated in the control unit, and allows de-activation of the light curtain apparatus only when operating state of the semiconductor device handler is in a predetermined "safe" operating state. When the light curtain apparatus is active and the light curtain is broken, the light curtain safety system causes the semiconductor device handler to terminate power flow to the robot mechanism.

20 Claims, 4 Drawing Sheets

LIGHT CURTAIN SAFETY SYSTEM FOR SEMICONDUCTOR DEVICE HANDLER

FIELD OF THE INVENTION

This invention relates to the manufacture of semiconductor devices, and more particularly to safety systems for semiconductor device handlers.

BACKGROUND OF THE INVENTION

IC manufacturers typically use Automated Test Equipment (ATE) systems to test their ICs before shipping to customers. Such ATE systems typically include an IC tester and an IC device handler. A device tester is an expensive piece of computing equipment that transmits test signals via tester probes to an interface structure. The interface structure transmits signals between the leads of an IC under test and the device tester. The device handler is an expensive precise robot for automatically moving ICs from a first storage area to the interface structure, sometimes by way of a preparation station where the ICs are heated or cooled before testing, and then from the interface structure to a second storage area. Such ATE systems are well known and take many forms.

FIG. 1 is a perspective view showing a simplified device handler 100, which is exemplary of the type of device handlers often utilized by IC manufacturers to facilitate high speed testing of their IC products. Device handler 100 is constructed in a box-shaped housing having two long vertical sides 101 and 103 (e.g., eight feet wide by six feet high), and two short vertical sides 105 and 107 (e.g., four feet wide by six feet high). Device handler 110 includes a control section 110, which is described below with reference to FIG. 2, and an operation section 120. In general, operation section 120 includes one or more robots (mechanisms) 121 that are operated using instruction signals generated by control section 110 to move ICs between various test/storage stations. For example, robot 121 may be programmed to move ICs from a first storage location 122 to a pre-heating station 123, to move heated ICs from preheating station 123 to a tester interface station 124 for testing, and from tester interface station 124 to a second storage location 125. Note that the depiction of robot 121 in FIG. 1 is greatly simplified for illustrative purposes, and that the actual mechanism used to move the ICs to the various stations of operation section 120 includes several separately movable motors and actuators that are mounted on a lower portion 126 and an upper portion 127 (which is shown in dashed lines for illustrative purposes).

FIG. 2 is a front elevation view showing front side 105 of device handler 100, and shows control section 110 in additional detail. Control section 110 provides a technician (user) interface station for purposes of programming a control unit 210, which in turn transmits control signals to robot 121 (FIG. 1) and other mechanisms of device handler 100. In particular, control unit 210 includes user-programmable electronic circuitry (i.e., a computer) that selectively transmits control signals to the servo motors of robot 121, thereby causing robot 121 to perform the various handler functions described above in a predefined sequence. The faceplate of control unit 210 includes a display 212 and a control panel 214. One or more input devices, such as a keyboard 216 and/or a mouse/trackball 218, are connected directly to control unit 210, for entering user-defined program instructions. Display 212 displays information associated with the programming and operation of device handler 100, including operating conditions and program instructions. Control panel 214 includes several switches and indicator lights that facilitate further control of control unit 210. For example, the operating mode (OP MODE) of control unit 210 is controlled by a teaching (TEACH) mode push-button switch 221 and a production (PROD) mode push-button switch 222. In addition, several switches and indicator lights are provided on control panel 214 that initiate and indicate the control state of control unit 210. For example, a "start" (run) control state is initiated by pressing a START push-button switch 223, and the start/run control state is indicated by lighting an associated indicator lamp 224. Similarly, a "pause" control state is initiated by pressing a PAUSE push-button switch 225, and the "pause" control state is indicated by lighting an associated indicator lamp 226. Control panel also includes an Emergency Machine Off (EMO) control section that includes an EMO push-button switch 227, whose function is described in additional detail below.

The operation of device handler 100 will now be described with reference to FIGS. 1 and 2. In general, the operation of device handler 100 requires an initial calibration ("teach") phase that is initiated, for example by pressing teaching mode push-button switch 221 (FIG. 2). During the teach phase robot 121 is calibrated, for example, to identify fixed reference positions for purposes of orientating a pickup arm of robot 121. After calibration, device handler 100 is switched into the production mode to perform testing operations. Typically, a test operation is initiated by entering an associated program into control unit 210, loading ICs into first storage location 122 (FIG. 1), pressing production mode push-button switch 222 (FIG. 2), and then pressing start/run push-button switch 223. Of course, those of ordinary skill in the art will understand that initiating a test operation is rarely this easy, and that a certain amount of fine tuning is required to maintain full scale testing operations by device handler 100. This fine tuning is typically performed while device handler 100 is in the production operating mode. When an error or misalignment of robot 121 is detected, pause push-button switch 225 is pressed to initiate a controlled stoppage of robot 121, a correction is performed (e.g., a code line of the program is changed to correct the error or misalignment, a robot portion is realigned, a temperature setting is changed, or a loose screw is retightened), and then the program is resumed by pressing run push-button switch 223.

A problem associated with conventional device handlers is that robot 121 and its associated mechanisms present very dangerous moving structures that can injure or maim a technician who accidentally places an arm or hand into operating section 120 while robot 121 is in operation. In particular, during both teaching mode and production mode operations, a technician is typically required to perform manual adjustments and maintenance activity that involve inserting his/her hands and arms into operating section 120. Normal safety procedures typically dictate that these adjustments take place only when, for example, a pause control state is initiated and all activity of robot 121 has terminated. However, conventional device handlers, such as the Seiko-Epson HM-3000 and HM-3500 Robotive IC Handler, produced by Seiko Epson of Tokyo, Japan, have been produced without sensors that are capable of detecting the presence of a technician's hands/arms in the operating section, and therefore cannot prevent such injuries from occurring when normal safety procedures are not followed. In the event of these injuries, the only "safety" mechanism available on conventional device handlers is EMO push-button switch 227, which, when pressed, immediately terminates the power supplied to robot 121. Unfortunately, this "safety"

mechanism is not designed to prevent injury, only to react to ongoing emergencies.

What is needed is a safety system that allows a technician to safely access the operating section of an IC device handler without risk of injury due to unanticipated operation of the handler's robot mechanism. In particular, what is needed is a safety system that is capable of sensing the presence of a technician's hands/arms in the operating section, and detecting the operating mode and/or control state of the IC device handler, and that can only be muted (disabled) when there is no danger of robot mechanism movement. What is also needed is a method for retrofitting existing IC device handlers with a safety system having these features that is both reliable and cost efficient.

SUMMARY OF THE INVENTION

The present invention is directed to a light curtain-type safety system that controls an activation state of a light curtain surrounding a semiconductor device handler such that the light curtain can be de-activated for accessing the handler robot mechanism only when the handler is in a predefined "safe" operating state (e.g., only when movement of the robot mechanism is not possible). Accordingly, when a technician attempts to manually deactivate (mute) the light curtain to perform a maintenance action on the robot mechanism while the handler is in an unsafe operating state, the light curtain-type safety system of the present invention precludes de-activation until the handler has transitioned to a safe operating state.

According to an embodiment of the present invention, the light curtain-type safety system includes a light curtain apparatus and a safety control circuit that includes a light curtain control module and an operating state detection circuit. The light curtain apparatus includes transmitters, receivers, and a mirror arrangement for generating a light curtain adjacent to the robot mechanism of the handler such that the only way a maintenance technician can access the robot mechanism is by breaking (i.e., passing through) the light curtain. The light curtain control module is connected to the transmitters and/or receivers of the light curtain apparatus to detect breaks in the light curtain, and transmits an emergency power off signal to the semiconductor device handler when the light curtain apparatus is broken while activated. The operating state detection circuit is connected to the control unit of the semiconductor device handler, and determines the operating state of the robot mechanism by the operating mode and control state of the control unit. When the control unit is in an unsafe operating mode/control state, the operating state detection circuit transmits a "mute control" signal to the light curtain control module that prevents de-activation of the light curtain, thereby maintaining safe operations and preventing injury. When the handler is placed in a safe operating mode/control state and a suitable period is allowed for the robot mechanism to complete all operations, the operating state detection circuit suspends the mute control signal, thereby allowing de-activation of the light curtain for maintenance purposes.

In accordance with an embodiment of the present invention, the light curtain-type safety apparatus is retrofitted onto a handler/tester system by tapping operating mode indicator signals and data line signals generated by the handler control unit, and utilizing these operating mode indicator signals to control the muting function of the light curtain safety apparatus. In one embodiment, these operating mode indicator signals are associated with indicator lamps that are respectively lit during "start" and "pause" control states during the normal (production) operating mode. In particular, these indicator signals are utilized to control relays that pass a light curtain enable signal to the light curtain control module only when the control unit is in a "safe" operating state (e.g., when the start/run indicator signal is de-asserted, and the pause indicator signal is asserted) and after a suitable delay period to allow the robot to cease all motion. Similarly, when the handler is in the teach operating mode, the light curtain-type safety apparatus is controlled by sensing keystrokes entered on the keyboard connected to the handler control unit, and de-activation of the light curtain is precluded until a predetermined period after a last keystroke is entered by a technician.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is described below with reference to a semiconductor device handler arrangement similar to that provided by Seiko-Epson HM-3000 and HM-3500 Handlers produced by Seiko-Epson Corporation of Tokyo, Japan. However, those skilled in the art of device testing will understand that the present invention can be utilized in many handler arrangements. Further, while the present invention is described below with specific reference to retrofitting a conventional handler, those skilled in the art of device testing will understand that the present invention may be integrated into the control system of a handler, thereby precluding the specific retrofitting details described herein.

Figure 1:
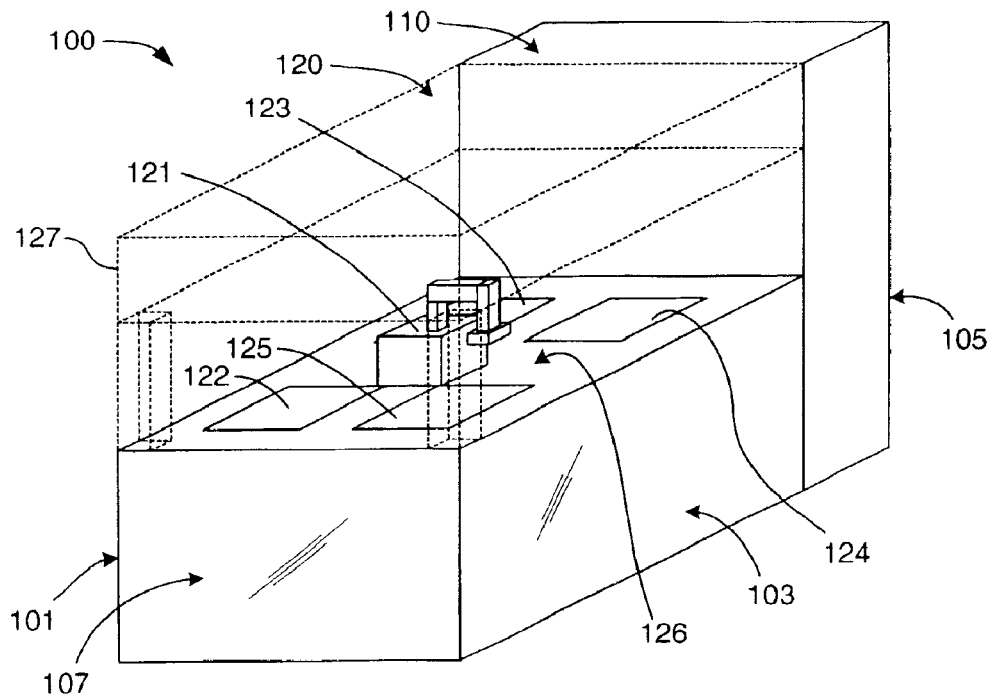
FIG. 1 is a perspective view showing a conventional semiconductor device handler.
Figure 2:
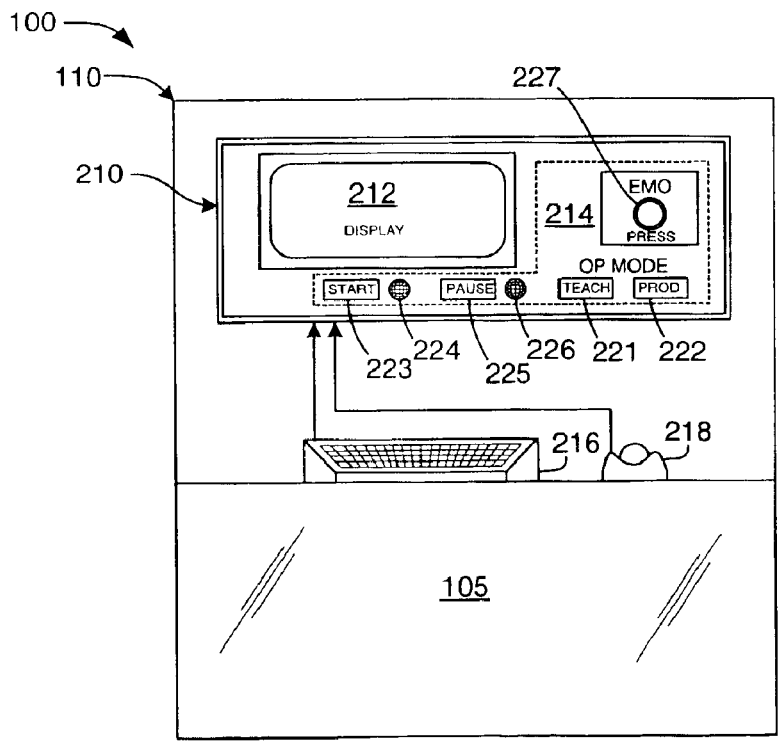
FIG. 2 is an elevation view showing a front side of the semiconductor device handler of FIG. 1.
Figure 3:
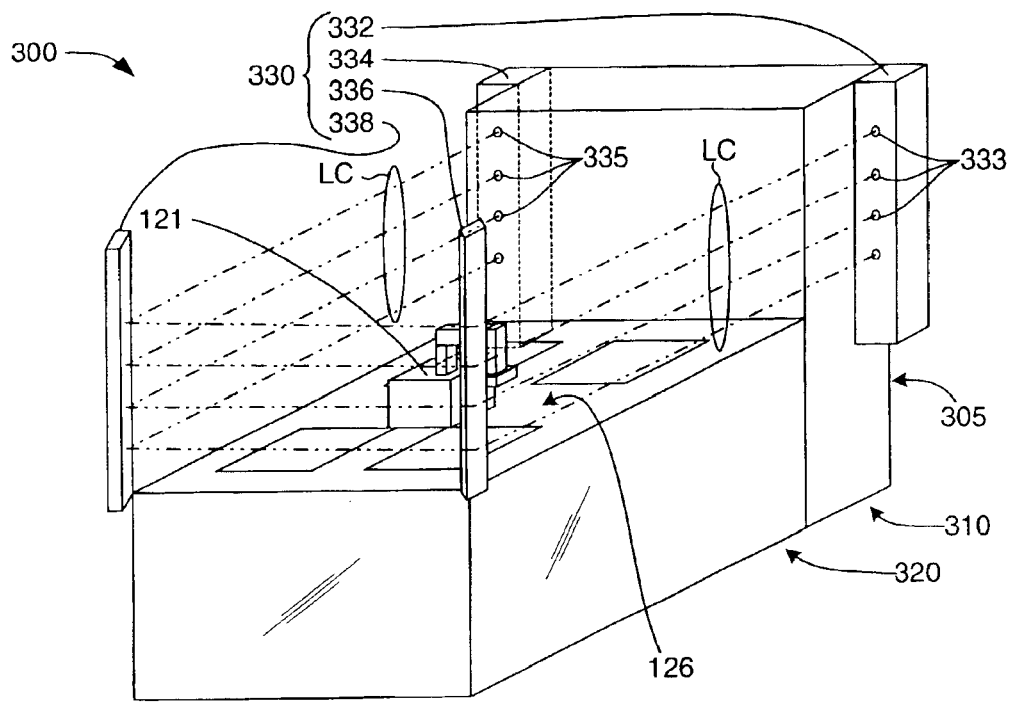
FIG. 3 is a perspective view showing a semiconductor device handler including a light curtain safety system according to an embodiment of the present invention.

FIG. 3 is a perspective view showing a handler 300 including a light curtain apparatus 330 according to the present invention. Other than the addition of light curtain apparatus 330 and associated safety system circuitry (described below), handler 300 is essentially identical to conventional handler 100 (described above). In particular, handler 300 is constructed in a box-shaped housing, and includes a control section 310 located on a front side 305 and an operation section 320 extending around the remaining three sides of the housing. Operation section 320 includes one or more robots (robot mechanisms) 121 that are operated using instruction signals generated by control section 310 to move ICs among various test/storage stations. Note that the depiction of robot 121 in FIG. 3 is greatly simplified for illustrative purposes, and that the actual mechanism used to move the ICs to the various stations of operation section 320 includes several separately movable motors and actuators that are mounted on a lower portion 126 and an upper portion, which is omitted for illustrative purposes.

As depicted in FIG. 3, light screen apparatus 330 generates a light curtain LC such that access to robot 121 requires a maintenance technician to break (i.e., pass a hand or arm through) the light curtain. Light curtain apparatus 330 includes an emitter unit 332 including several light emitters 333 mounted thereon, a receiver unit 334 including several light receivers 335 mounted thereon, and mirrors 336 and 338 arranged such that each light beam transmitted from a light emitter 333 is reflected to a corresponding light receiver 335, thereby forming light curtain LC. As utilized herein, the phrase "breaking the light curtain" refers to the act of blocking one or more of the parallel light beams (e.g., by reaching through the light curtain to access robot 121) such that the blocked light beam fails to reach its corresponding receiver 335.

Figure 4:
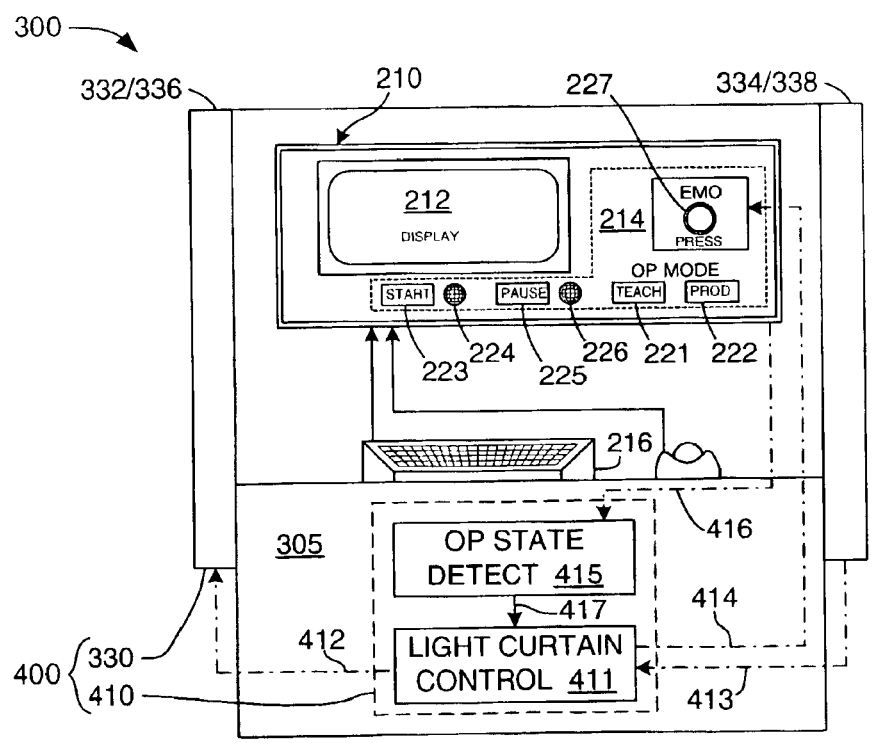
FIG. 4 is an elevation view showing a front side of the semiconductor device handler of FIG. 3.

FIG. 4 is a front elevation view showing front side 305 of device handler 300, and shows control section 310 in additional detail. Similar to control section 110 of conventional handler 100 (described above), control section 310 provides a technician (user) interface station for purposes of programming control unit 210, which in turn transmits control signals to robot 121 (FIG. 3) and other mechanisms of device handler 300. As described above, control unit 210 includes user-programmable electronic circuitry (e.g., a computer), and the faceplate of control unit 210 includes a display 212 and a control panel 214. One or more input devices, such as a keyboard 216 and/or a mouse/trackball, are connected directly to control unit 210 for entering user-defined program instructions. For illustrative purposes, control panel 214 is shown to include teach (TEACH) mode push-button switch 221, production (PROD) mode push-button switch 222, a "START" (run) push-button switch 223 and its associated indicator lamp 224, and a "PAUSE" push-button switch 225 and its associated indicator lamp 226. Control panel also includes Emergency Machine Off (EMO) push-button switch 227. Note that teach mode push-button switch 221 and production mode push-button switch 222 are shown for illustrative purposes only—in actual embodiments, push-button switches 221 and 222 are typically omitted, and selection of the handler operating mode (teach or production) is controlled using, for example, associated commands entered through keyboard 216.

Referring to the lower portion of FIG. 4, according to the present invention, handler 300 includes a light curtain safety system 400 made up of light curtain apparatus 330 (described above with reference to FIG. 3), and a safety control circuit 410 that controls the operation (e.g., activation and de-activation) of light curtain apparatus 330 by detecting an operating state of handler 300 (e.g., as determined by control unit 210) such that the light curtain can be de-activated for accessing the robot mechanism only when control unit 210 is in one or more predefined "safe" operating states (e.g., only when movement of robot 121 is precluded). Conventional light curtain systems typically allow a technician to de-activate ("mute") the light curtain in order, for example, to reach through the de-activated light curtain to perform maintenance on the robot mechanism. A problem with this conventional arrangement is that after maintenance is completed, the technician may fail to re-activate the light curtain before entering an active robot operating state, thereby placing the technician in danger of injury. In contrast to conventional light curtain control, light curtain safety system 400 receives one or more control/operation signals from control unit 210, and prevents a technician from initiating or maintaining the light curtain in a deactivated state unless these control/operation signals are in one of the predefined "safe" operating states. Therefore, even if the technician de-activates the light curtain during a "safe" operating state, subsequent shift to an "unsafe" operating state automatically re-activates the light curtain. In this active state, any breakage of the light curtain causes control unit 210 to terminate power flow to the robot mechanism, thereby preventing injury to the technician. Conversely, when a technician attempts to de-activate the light curtain while control unit 210 is in an unsafe operating state, light curtain safety system 400 precludes de-activation until handler 300 has transitioned to a "safe" operating state.

As indicated in FIG. 4, in accordance with an embodiment of the present invention, light curtain safety system 400 is retrofitted to a conventional handler (e.g., a Seiko-Epson HM-3000 or HM-3500 Handler) utilizing a light curtain apparatus 330, and a safety control circuit 410 that includes a light curtain control module 411 and an operating state detection (OP STATE DETECT) circuit 415. In one embodiment, light curtain apparatus 330 and light curtain control module 411 are produced under model number MFU-M1 (Multi-function Safety Module) by Smartscan Incorporated of Livornia, Michigan. The addition of operating state detection circuit 415, described below, allows this light curtain apparatus and control module to function in the manner described herein.

Referring to the lower portion of FIG. 4, light curtain control module 411 is connected to emitter unit 332 via connection 412, and to receiver unit 334 by connection 413. An emergency stop signal 414, which is asserted when light curtain apparatus 330 is active and the light curtain is broken, is connected from light curtain control module 411 to an associated breaker circuit associated with EMO push-button switch 227 using known techniques. In one embodiment, EMO push-button switch 227 controls a primary relay contactor to a main transformer (not shown) of handler 300, and pressing push-button switch 227 causes the primary relay contactor to open, which powers off the robot mechanism in 30–40 milliseconds. In a similar manner, the current holding the primary relay contactor is controlled by emergency stop signal 414 such that when emergency stop signal 414 is de-asserted (e.g., zero Volts), the primary relay contactor is opened.

Operating state detection circuit 415 is connected to one or more operating state signals 416 generated by control unit 210, and generates a mute enable control signal 417 that is transmitted to an appropriate terminal of light curtain control module 411 such that the light curtain can be de-activated only when operating state signal 416 indicates that control unit 210 is in a predetermined "safe" operating state. Examples of actual operating state signals and logic circuitry utilized to perform the functions of operating state detection circuit 415 are provided below with reference to a specific example. However, those of ordinary skill in the art will recognize that the specific signals utilized to detect the operating state of handler 300 are not limited to those described below, but may include other signals specifically generated for operating state detection.

Figure 5:
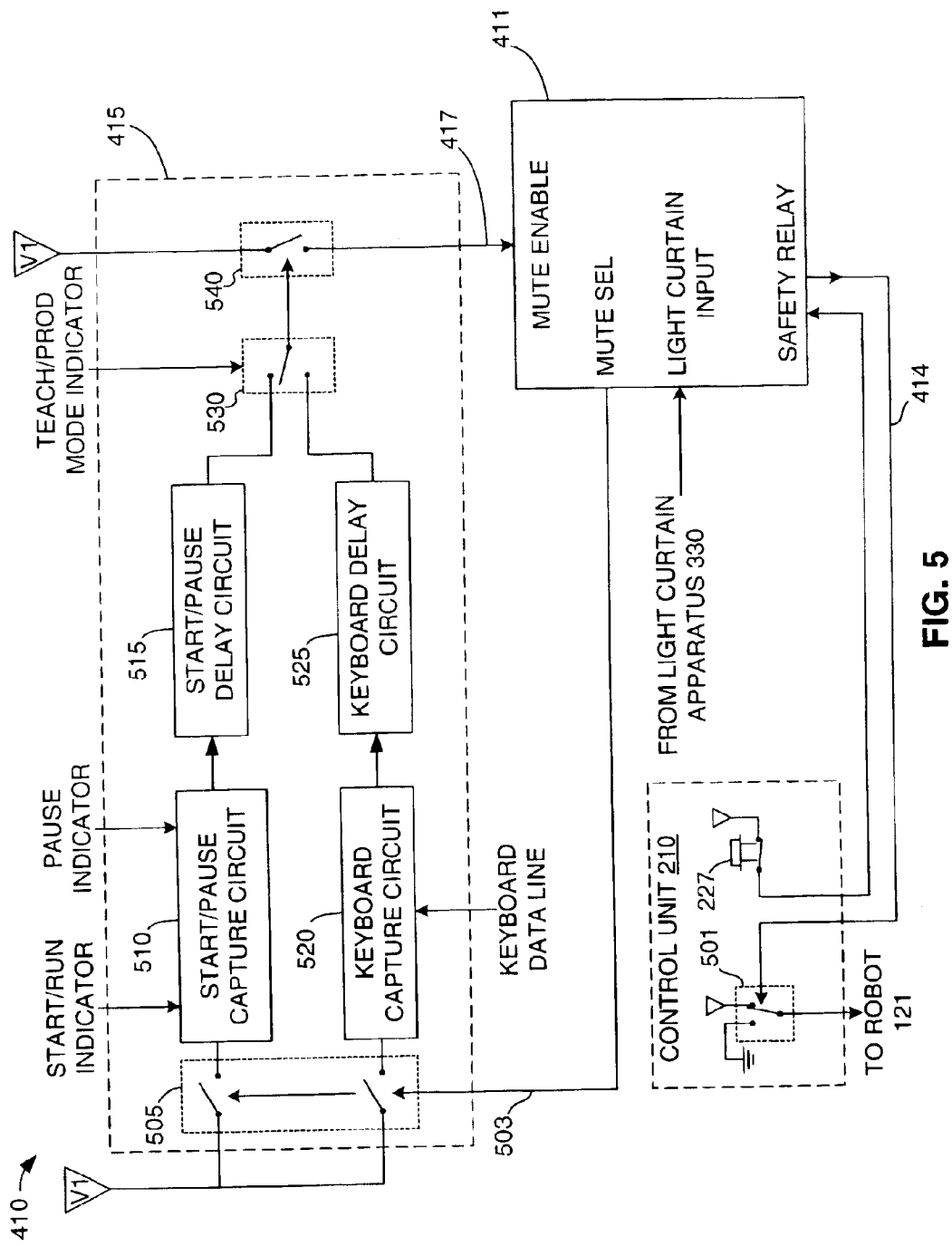
FIG. 5 is a block diagram showing a safety control circuit of the light curtain safety system according to a specific embodiment of the present invention.

FIG. 5 is a simplified block diagram showing safety control circuit 410 according to a specific embodiment of the present invention. In the present embodiment, safety control circuit 410 is separately constructed and connected (retrofitted) to control unit 210 as described below.

Referring to the lower portion of FIG. 5, light curtain control module 411 is implemented using an MFU-M1

Multi-function Safety Module produced by Smartscan Incorporated. As indicated, a safety relay (or two safety relays) provided on light curtain control module 411 is connected in series with EMO push-button switch 227 to provide emergency stop signal 414, which controls a primary relay contactor 501 to selectively couple a main transformer (not shown) to robot 121 (shown in FIG. 3). Light curtain control module 411 also includes a light curtain input signal that indicates the condition (i.e., broken or not broken) of the light curtain, and a mute select terminal that generates a mute select signal 503 when a technician manually or otherwise attempts to set light curtain apparatus 330 in the de-activated ("muted") mode. Finally, light curtain control module 411 receives mute enable control signal 417 from operating state detection circuit 415, which is generated in the manner described below.

Referring to the upper portion of FIG. 5, operating state detection circuit 415 includes a mute select relay switch 505, a start/pause capture circuit 510 and an associated start/pause delay circuit 515, a keyboard capture circuit 520 and an associated keyboard delay circuit 525, a mode control switch 530, and a mute enable relay switch 540.

Mute select relay switch 505 selectively couples a voltage source V1 (e.g., 24 Volts) to start/pause capture circuit 510 and keyboard capture circuit 520 when a technician manually switches light curtain control module 411 to its de-activate ("mute") setting. That is, when the mute command is entered, mute select (MUTE SEL) signal 503 is generated by light curtain control module 411 to close mute select relay switch 505, thereby coupling voltage source V1 to start/pause capture circuit 510 and keyboard capture circuit 520, which in turn "authorize" the light curtain de-activation in the manner described below. In contrast, when a mute command has not been entered, mute select signal 503 is not asserted, and, therefore, mute select relay switch 505 remains open, thereby precluding any possibility of a mute setting. Note that mute select relay switch 505 may be omitted in some embodiments.

Start/pause capture circuit 510 and keyboard capture circuit 520 are alternatively utilized in the production operating mode and teach operating mode, respectively, and are alternatively selected using mode control switch 530. That is, in the production mode, mode control switch 530 is set such that start/pause capture circuit 510 is coupled (through start/pause delay circuit 515) to mute enable relay switch 540, and passes a high (e.g., 24 Volt) signal to mute enable relay switch 540 when a start/run indicator signal and a pause indicator signal are in a predetermined state for a predetermined delay period. Alternatively, in the teach mode, mode control switch 530 is set such that keyboard capture circuit 520 is coupled (through keyboard delay circuit 525) to mute enable relay switch 540, and passes the high (e.g., 24 Volt) signal to mute enable relay switch 540 when a keyboard data line signal is in a predetermined state for a predetermined delay period. The reason for separate capture circuits for the production and teach operating modes will become clear below. However, it is noted that a beneficial safety system can be provided that includes only one of start/pause capture circuit 510 and keyboard capture circuit 520, although such a safety circuit may not prevent injury when the handler is in the teach operating mode and production operating mode, respectively.

Referring briefly to FIG. 4, according to an aspect of the present invention, semiconductor device handler 300 is retrofitted to include light curtain safety system 400 by tapping selected signals transmitted within control unit 214. In one embodiment, the start/run indicator signal directed to start/run capture circuit 510 (FIG. 5) is derived from the current used to drive start/run indicator lamp 224 (FIG. 4). That is, when handler 300 is in the production mode and start/run push-button switch 223 is depressed, the start/run control state initiated by this button is indicated by asserting the start/run indicator signal, thereby causing indicator lamp 224 to emit light. Similarly, the pause indicator signal directed to pause capture circuit 520 (FIG. 5) is derived from the current used to drive pause indicator lamp 226 (FIG. 4). That is, when handler 300 is in the production mode and pause push-button switch 225 is depressed, the pause control state initiated by this button is indicated by asserting the pause indicator signal, thereby causing indicator lamp 226 to emit light. These indicator signals are reliable indications of the control state of handler 300 during the production operating mode, and are utilized as described below to facilitate de-activation of the light curtain by detecting a "safe" operating state of handler 300.

Although indicator light signals can be utilized in the production mode, other modes may not provide such signals that clearly indicate possible movement of the robot mechanism. For example, when the Seiko-Epson HM-3000 and HM-3500 Handlers are in the teach operating mode, there are no reliable logic signals (e.g., indicator lamp signals) that can be utilized to control the light curtain. However, in the teach operating mode, all motion commands to the robot mechanism are entered through keyboard 216 (FIG. 4). Therefore, according to another aspect of the present invention, a keyboard data line signal transmitted from keyboard 216 to control unit 210 is detected by keyboard capture circuit 520 (FIG. 5), and utilized to detect potential movement of the robot mechanism in the manner described below.

Figure 6:
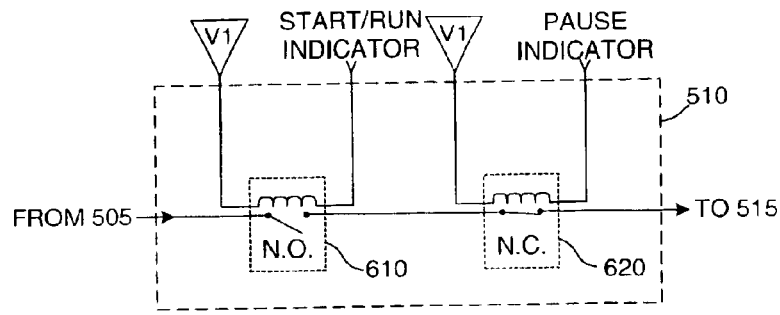
FIG. 6 is a simplified circuit diagram showing a start/pause capture circuit of the safety control circuit shown in FIG. 5.

FIG. 6 is a simplified circuit diagram showing start/pause capture circuit 510 according to an embodiment of the present invention. Start/pause capture circuit 510 includes a normally open (first) relay switch 610 connected in series with a normally closed (second) relay switch 620 between mute select relay switch 505 and start/pause delay circuit 515. Relay switch 610 is controlled by the start/run indicator signal tapped from control unit 210 (FIG. 4) in the manner described above. Similarly, relay switch 620 is controlled by the pause indicator signal tapped from control unit 210 (FIG. 4). Note that the resulting "pause-not-start" control logic provided by start/pause capture circuit 510 prevents de-activation of the light curtain in the production mode either when the pause indicator signal is de-asserted (i.e., indicating the pause control state is not active), or when the start/run indicator signal is asserted (i.e., indicating that the start/run control state is active). Specifically, start/pause capture circuit 510 passes the (e.g., 24 Volt) signal received from mute select relay switch 505 only when the handler is in a "safe" operating state defined by being in the pause control state and not being in start/run control state. Note that the "safe" operating state may be defined only by the start/run control state (i.e., relay switch 620 is omitted from the circuit shown in FIG. 6), or may be defined only by the pause control state (i.e., relay switch 610 is omitted from the circuit shown in FIG. 6), however these alternative structures may produce unsafe situations that can be avoided by utilizing both indicator signals as shown in FIG. 6.

Referring again to FIG. 5, when start/pause capture circuit 510 initially detects a "safe" control state (i.e., both relay switches are closed), voltage V1 is passed to start/pause delay circuit 515. Start/pause delay circuit 515 is in one embodiment a dip switch-type delay selector (e.g., delay on make model TDU3000A, produced by SSAC Inc. of Baldwinsville, N.Y.), and passes the voltage V1 on to mute enable relay switch 540 via mode control switch 530. The purpose for start/pause delay circuit 515 is to allow time for all robot motion to terminate before authorizing de-activation of the light curtain. That is, unlike emergency machine off operations in which power to the robot mechanism is immediately terminated, the pause control operation allows the robot to finish any currently executed operations, thereby maintaining the integrity of the executing program and facilitating resumption of the program when the need for the pause state is eliminated. Accordingly, start/pause delay circuit 515 provides a suitable delay time (e.g., 30 seconds) to allow all robot motion to cease before passing the voltage V1 on to mute enable relay switch 540 via mode control switch 530.

As mentioned above, keyboard capture circuit 520 provides a second path for coupling voltage V1 to mute enable relay switch 540, in this case during the teach operating mode, and involves detecting a keyboard data line signal transmitted from keyboard 216 to control unit 210 (FIG. 4).

Figure 7:
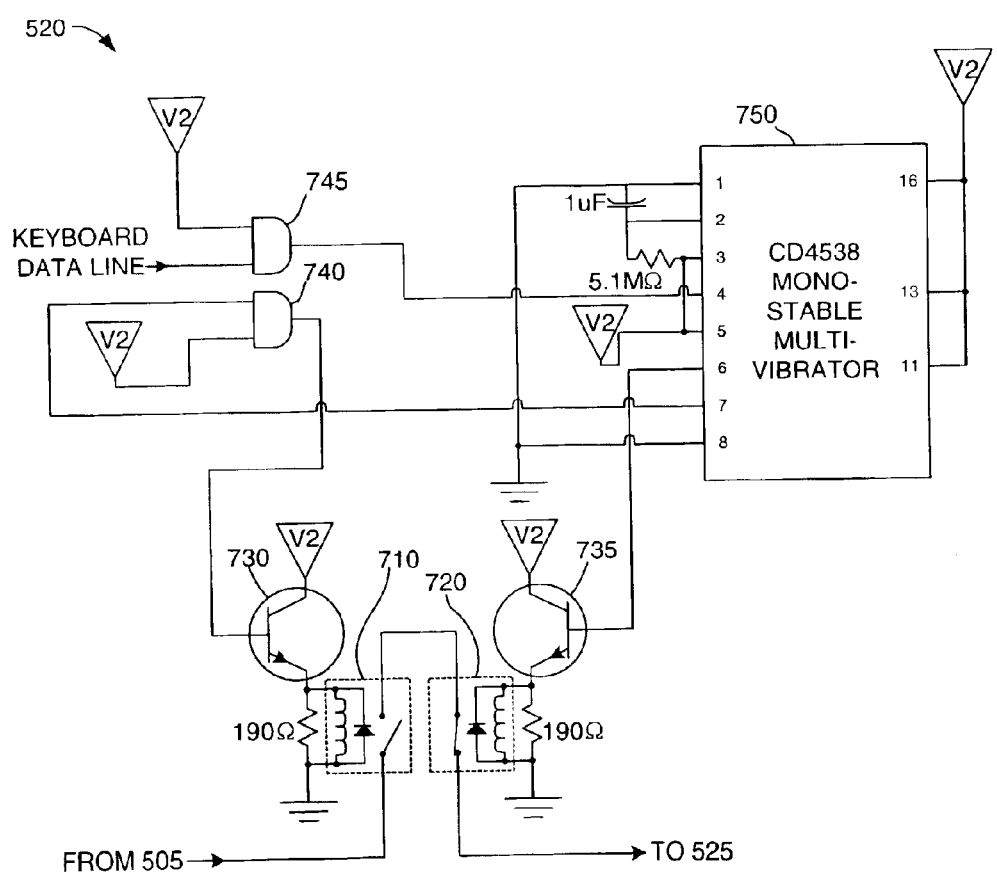
FIG. 7 is a simplified circuit diagram showing a keyboard capture circuit of the safety control circuit shown in FIG. 5.

FIG. 7 is a simplified circuit diagram showing keyboard capture circuit 520 according to an embodiment of the present invention. Keyboard capture circuit 520 includes a normally open (first) relay switch 710 (e.g., dip reed relay AD1A05D, produced by American Relays, Inc. of Santa Fe Springs, Calif.) connected in series with a normally closed (second) relay switch 720 (e.g., dip reed relay AD1B05D, produced by American Relays, Inc.) between mute select relay switch 505 and start/pause delay circuit 515. First relay switch 710 is connected to the emitter of a first npn switching transistor 730 (e.g., type 2N2222) in the manner shown in FIG. 7. Similarly, second relay switch 720 is connected to the emitter of a second npn switching transistor 735 (e.g., type 2N2222). The collector of first and second npn switching transistors 730 and 735 are connected to an appropriate voltage source V2 (e.g., 5 Volts). The base of first npn switching transistor 730 is connected to the output terminal of a first AND gate 740, whose input terminals are connected to voltage source V2 and to a monostable multivibrator 750 in the manner shown in FIG. 7. A second AND gate 745 has input terminals connected to voltage source V2 and to the keyboard data line signal, and an output terminal connected to monostable multivibrator 750 in the manner shown in FIG. 7. With this arrangement, each time a technician presses a key of keyboard 216 (FIG. 4), the circuitry of keyboard capture circuit 520 opens one of relays 710 and 720 for a predetermined delay period (e.g., 3 seconds). This delay is provided to prevent downstream relay "chattering" while a robot command is being entered. Once the last keystroke is entered, and after the predetermined (e.g., 3 second) delay period, both relays 710 and 720 are closed to pass voltage V1 from mute select relay switch 505 to keyboard delay circuit 525, which introduces an additional delay (e.g., 30 seconds) that is designed to allow all robot motion to terminate.

Referring again to FIG. 5, when voltage V1 is passed by either of start/run capture circuit 510 (i.e., during production operating modes) or keyboard capture circuit 520 (i.e., during teach operating mode), this passed voltage closes (turns on) mute enable relay switch 540 such that mute enable control signal 417 (e.g., voltage V1) is transmitted to a mute enable (or mute authorize) terminal of light curtain control module 411. Accordingly, after a technician selects (requests) de-activation of the light curtain by, for example, pressing a "mute" button provided on light curtain control module 411, actual de-activation of the light curtain is precluded until operating state detection circuit 415 provides mute enable control signal 417, thereby preventing injury to the technician by preventing the technician from accessing the robot when the handler is in an "unsafe" operating state.

Although the present invention has been described with respect to certain specific embodiments, it will be clear to those skilled in the art that the inventive features of the present invention are applicable to other embodiments as well, all of which are intended to fall within the scope of the present invention. For example, the light curtain safety system is not necessarily limited to handlers, may be used in other test/production equipment including robot mechanisms. Accordingly, all such modifications are deemed to be within the scope of the invention, which is to be limited only by the appended claims and their equivalents.

What is claimed is:

1. A light curtain safety system for controlling a semiconductor device handler, the semiconductor device handler including a control unit and a robot mechanism that is selectively operated in response to signals generated by the control unit, wherein the light curtain safety system comprises:

a light curtain apparatus for generating a light curtain adjacent to the robot mechanism such that accessing the robot mechanism requires breaking the light curtain; and means for controlling an activation state of the light curtain apparatus by detecting an operating state of the semiconductor device handler and allowing de-activation of the light curtain apparatus only when the operating state of the semiconductor device handler is in a predetermined operating state, wherein said means causes the semiconductor device handler to terminate power flow to the robot mechanism when the light curtain apparatus is activated and the light curtain is broken.

2. The light curtain safety system according to claim 1, wherein said means comprises a start capture circuit that detects a start operating state of the semiconductor device handler when the semiconductor device handler is in a production operating mode.

3. The light curtain safety system according to claim 2, wherein said means further comprises a delay circuit connected in series with the start capture circuit.

4. The light curtain safety system according to claim 1, wherein said means comprises a pause capture circuit that detects a pause operating state of the semiconductor device handler when the semiconductor device handler is in a production operating mode.

5. The light curtain safety system according to claim 4, wherein said means further comprises a start capture circuit connected in series with the pause capture circuit, wherein the start capture circuit detects a start operating state of the semiconductor device handler when the semiconductor device handler is in a production operating mode.

6. The light curtain safety system according to claim 5, wherein said means further comprises a delay circuit connected in series with the start capture circuit and the pause capture circuit.

7. The light curtain safety system according to claim 1, wherein said means comprises a keyboard capture circuit that detects a keyboard data transmission to the control unit of the semiconductor device handler when the semiconductor device handler is in a teach operating mode.

8. The light curtain safety system according to claim 7, wherein said means further comprises a delay circuit connected in series with the keyboard capture circuit.

9. A light curtain safety system for controlling a semiconductor device handler, the semiconductor device handler including a control unit and a robot mechanism that is selectively operated in response to signals generated by the control unit, wherein the light curtain safety system comprises:

a light curtain apparatus for generating a light curtain adjacent to the robot mechanism such that accessing the robot mechanism requires breaking the light curtain; and a safety control circuit including:

a light curtain control module for transmitting an emergency power off signal to the semiconductor device handler when the light curtain apparatus is activated and the light curtain is broken; and an operating state detection circuit for detecting an operating state of the semiconductor device handler, and for generating a mute control signal for controlling the light curtain control module such that the light curtain can be de-activated only when the operating state of the semiconductor device handler is in a predetermined operating state.

10. The light curtain safety system according to claim 9, wherein said operating state detection circuit comprises a start capture circuit that detects a start operating state of the semiconductor device handler when the semiconductor device handler is in a production operating mode.

11. The light curtain safety system according to claim 10, wherein said operating state detection circuit further comprises a delay circuit connected in series with the start capture circuit.

12. The light curtain safety system according to claim 9, wherein said operating state detection circuit comprises a pause capture circuit that detects a pause operating state of the semiconductor device handler when the semiconductor device handler is in a production operating mode.

13. The light curtain safety system according to claim 12, wherein said operating state detection circuit further comprises a start capture circuit connected in series with the pause capture circuit, wherein the start capture circuit detects a start operating state of the semiconductor device handler when the semiconductor device handler is in a production operating mode.

14. The light curtain safety system according to claim 13, wherein said operating state detection circuit further comprises a delay circuit connected in series with the start capture circuit and the pause capture circuit.

15. The light curtain safety system according to claim 9, wherein said operating state detection circuit comprises a keyboard capture circuit that detects a keyboard data transmission to the control unit of the semiconductor device handler when the semiconductor device handler is in a teach operating mode.

16. The light curtain safety system according to claim 15, wherein said operating state detection circuit further comprises a delay circuit connected in series with the keyboard capture circuit.

17. A method for retrofitting a semiconductor device handler to include a light curtain safety system, the semiconductor device handler including a control unit and a robot mechanism that is selectively operated in response to signals generated by the control unit, wherein the method comprises:

positioning a light curtain apparatus adjacent to the semiconductor device handler such that accessing the robot mechanism requires breaking a light curtain generated by the light curtain apparatus;

detecting an operating state of the semiconductor device handler by sensing an associated signal generated in the control unit;

controlling the light curtain apparatus such that the light curtain apparatus is activated only when the semiconductor device handler is in a first predetermined operating state, wherein when-the light curtain apparatus is activated, an emergency power off signal is transmitted to the control unit when the light curtain is broken; and controlling the light curtain apparatus such that the light curtain apparatus is de-activated only when the semiconductor device handler is in a second predetermined operating state.

18. The method according to claim 17, wherein detecting the operating state of the semiconductor device handler comprises detecting a current directed to an indicator lamp that is lit when the semiconductor device handler is in a start control state during a production operating mode.

19. The method according to claim 17, wherein detecting the operation state of the semiconductor device handler comprises detecting a current directed to an indicator lamp that is lit when the semiconductor device handler is in a pause control state during a production operating mode.

20. The method according to claim 17, wherein detecting the operating state of the semiconductor device handler comprises detecting a data signal transmitted to the control unit from a keyboard when the semiconductor device handler is a teach operating mode.

* * * * *